US008912593B2

(12) United States Patent
Matsuda

(10) Patent No.: US 8,912,593 B2
(45) Date of Patent: Dec. 16, 2014

(54) METHOD FOR MANUFACTURING SEMICONDUCTOR DEVICE AND SEMICONDUCTOR DEVICE

(71) Applicant: Kabushiki Kaisha Toshiba, Minato-ku (JP)

(72) Inventor: Toru Matsuda, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/916,069

(22) Filed: Jun. 12, 2013

(65) Prior Publication Data

US 2013/0334591 A1 Dec. 19, 2013

(30) Foreign Application Priority Data

Jun. 14, 2012 (JP) ................................. 2012-134777

(51) Int. Cl.
*H01L 29/792* (2006.01)
*H01L 29/66* (2006.01)
*H01L 27/115* (2006.01)

(52) U.S. Cl.
CPC ...... *H01L 29/66833* (2013.01); *H01L 27/1157* (2013.01); *H01L 29/792* (2013.01); *H01L 27/11582* (2013.01); *H01L 29/7926* (2013.01)
USPC ...... 257/324; 257/314; 257/326; 257/E21.21; 257/E29.103

(58) Field of Classification Search
CPC .................. H01L 27/11578; H01L 27/11551; G11C 16/0433
USPC ................. 257/314–326, E27.103, E29.309, 257/E21.21, 750–760
See application file for complete search history.

(56) References Cited

U.S. PATENT DOCUMENTS

| 7,910,432 | B2 | 3/2011 | Tanaka et al. | |
|---|---|---|---|---|
| 8,338,956 | B2 | 12/2012 | Maeda | |
| 2009/0230462 | A1 | 9/2009 | Tanaka et al. | |
| 2010/0213526 | A1* | 8/2010 | Wada et al. | 257/314 |
| 2011/0031550 | A1* | 2/2011 | Komori et al. | 257/324 |
| 2011/0108907 | A1 | 5/2011 | Maeda | |
| 2011/0169071 | A1 | 7/2011 | Uenaka et al. | |

FOREIGN PATENT DOCUMENTS

| JP | 2009-224612 A | 10/2009 |
|---|---|---|
| JP | 2011-100921 A | 5/2011 |
| JP | 2011-142276 A | 7/2011 |

* cited by examiner

*Primary Examiner* — Cuong Q Nguyen
*Assistant Examiner* — Nishath Yasmeen
(74) *Attorney, Agent, or Firm* — Oblon, Spivak, McClelland, Maier & Neustadt, L.L.P.

(57) ABSTRACT

According to one embodiment, a method is disclosed for manufacturing a semiconductor device. The method includes forming a second stacked body on the planarized interlayer insulating film and on the uppermost stair. The second stacked body includes a second conductive film thicker than the first conductive film and a second insulating film stacked on the second conductive film. The method includes dividing the second stacked body into a select gate on the uppermost stair and a plurality of wall portions in a staircase region below the uppermost stair. The method includes forming a plurality of vias piercing the interlayer insulating film under a region between the wall portions and reaching the first conductive film of each of the stairs.

9 Claims, 21 Drawing Sheets

METHOD FOR MANUFACTURING SEMICONDUCTOR DEVICE AND SEMICONDUCTOR DEVICE

CROSS-REFERENCE TO RELATED APPLICATION

This application is based upon and claims the benefit of priority from Japanese Patent Application No. 2012-134777, filed on Jun. 14, 2012; the entire contents of which are incorporated herein by reference.

FIELD

Embodiments described herein relate generally to a method for manufacturing a semiconductor device and a semiconductor device.

BACKGROUND

A memory device of a three-dimensional structure is proposed in which a memory hole is formed in a stacked body in which an electrode film functioning as the control gate of a memory cell and an insulating film are alternately stacked in plural, and a silicon body serving as a channel is provided on the side wall of the memory hole via a charge storage film.

As a structure for connecting each of the plurality of stacked electrode films to another interconnection independently, a structure in which the plurality of electrode films are fashioned in a staircase configuration is proposed.

DETAILED DESCRIPTION

Figure 1:
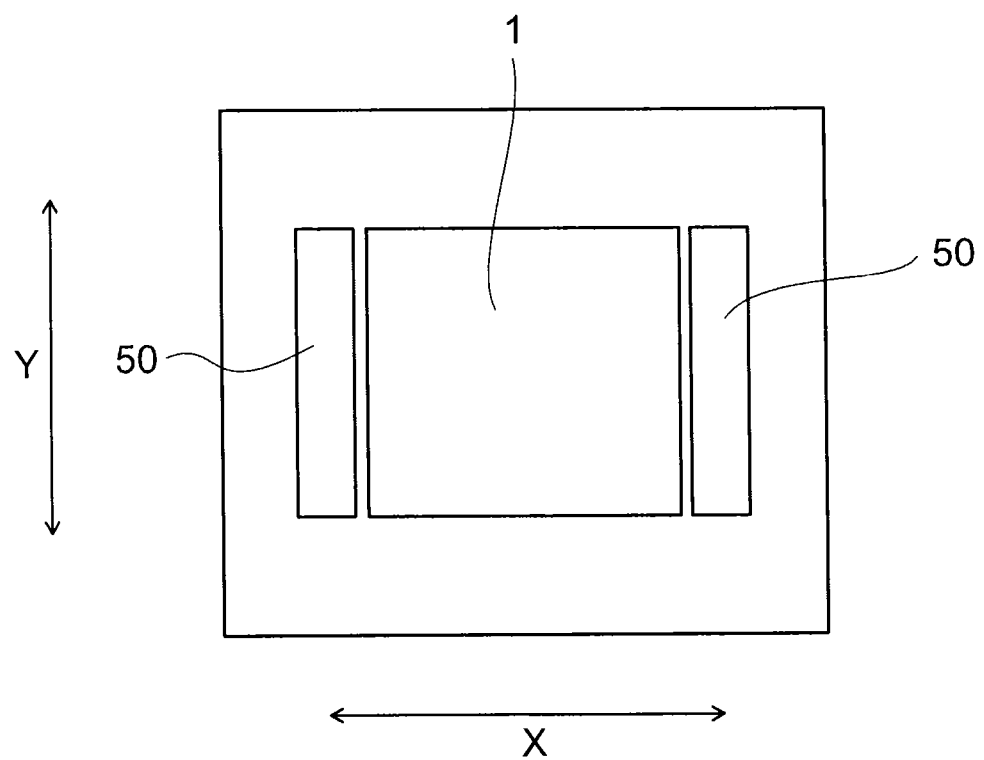
FIG. 1 is a schematic plan view showing an arrangement relationship between a memory cell array and a staircase-like contact unit in a semiconductor device according to an embodiment.

According to one embodiment, a method is disclosed for manufacturing a semiconductor device. The method includes processing a part of a first stacked body into a staircase configuration to form a plurality of stairs. The first stacked body includes a first insulating film and a first conductive film alternately stacked in a plurality. The method includes forming an interlayer insulating film on the first stacked body so as to fill a level difference between the stairs. The method includes recessing a height of an upper surface of the interlayer insulating film to a height of an uppermost stair to planarize the interlayer insulating film. The method includes forming a second stacked body on the planarized interlayer insulating film and on the uppermost stair. The second stacked body includes a second conductive film thicker than the first conductive film and a second insulating film stacked on the second conductive film. The method includes dividing the second stacked body into a select gate on the uppermost stair and a plurality of wall portions in a staircase region below the uppermost stair. The method includes forming a plurality of vias piercing the interlayer insulating film under a region between the wall portions and reaching the first conductive film of each of the stairs.

Various embodiments will be described hereinafter with reference to the accompanying drawings.

In the drawings, identical components are marked with the same reference numerals.

FIG. 1 is a schematic plan view showing an arrangement relationship between a memory cell array 1 and a staircase-like contact unit 50 in a semiconductor device of an embodiment. Two orthogonal directions in the plan view are defined as a first direction (the X direction) and a second direction (the Y direction). FIG. 1 corresponds to the region of one chip.

The memory cell array 1 is formed in the center of the chip. The staircase-like contact unit 50 is formed on the outside in the X direction of the memory cell array 1. A circuit that drives the memory cell array 1 etc. are formed in a region around the memory cell array 1 and the staircase-like contact unit 50.

Figure 2:
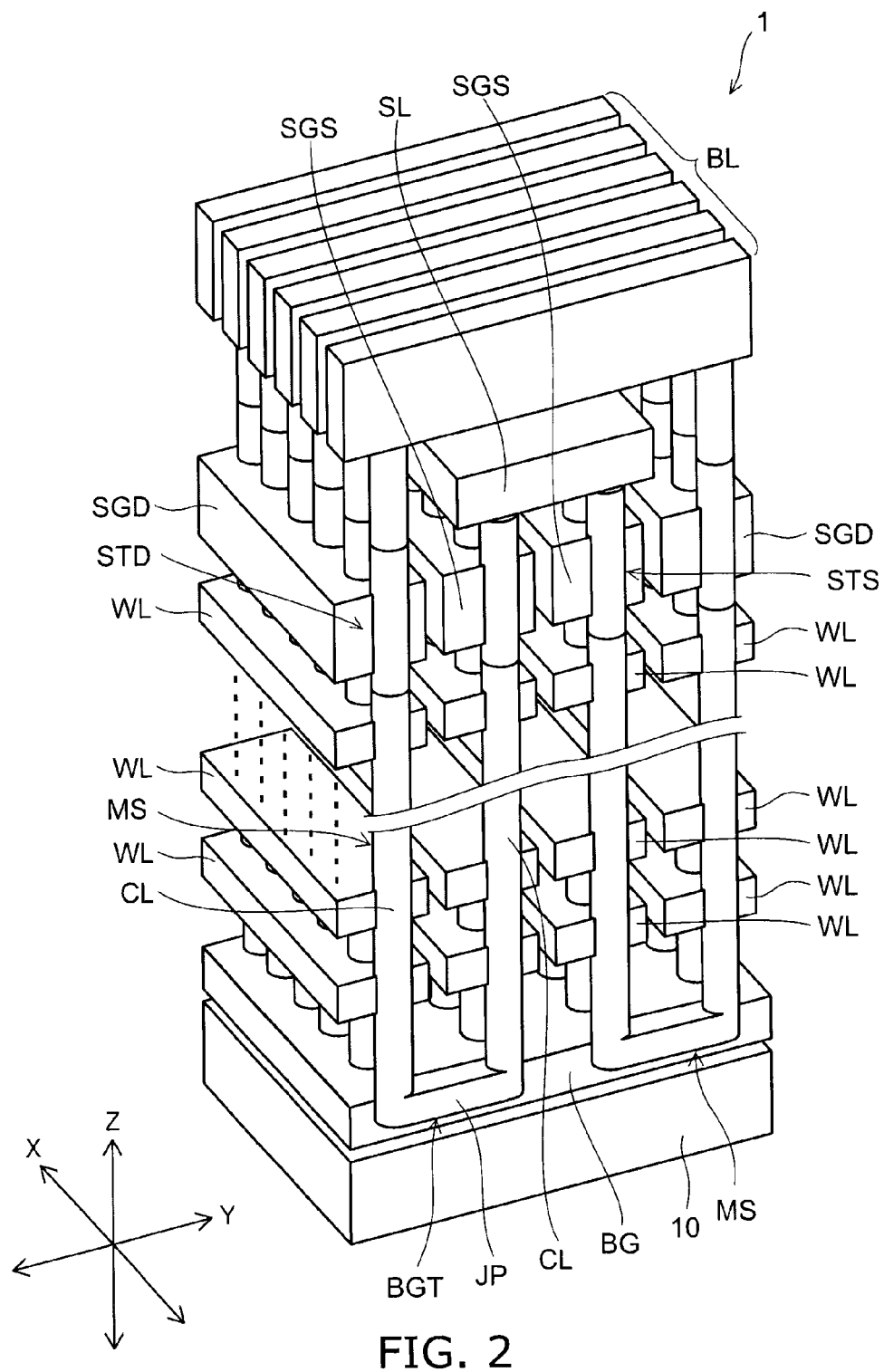
FIG. 2 is a schematic perspective view of the memory cell array in the semiconductor device according to the embodiment.

FIG. 2 is a schematic perspective view of the memory cell array 1. In FIG. 2, the illustration of the insulating portions is omitted for easier viewing of the drawing.

In FIG. 2, an XYZ orthogonal coordinate system is introduced. Two directions parallel to the major surface of a substrate 10 and orthogonal to each other are defined as the X direction and the Y direction, and the direction orthogonal to both of the X direction and the Y direction is defined as the Z direction (a third direction or the stacking direction). The X direction and the Y direction in FIG. 2 correspond to the X direction and the Y direction in FIG. 1, respectively.

Figure 8A:
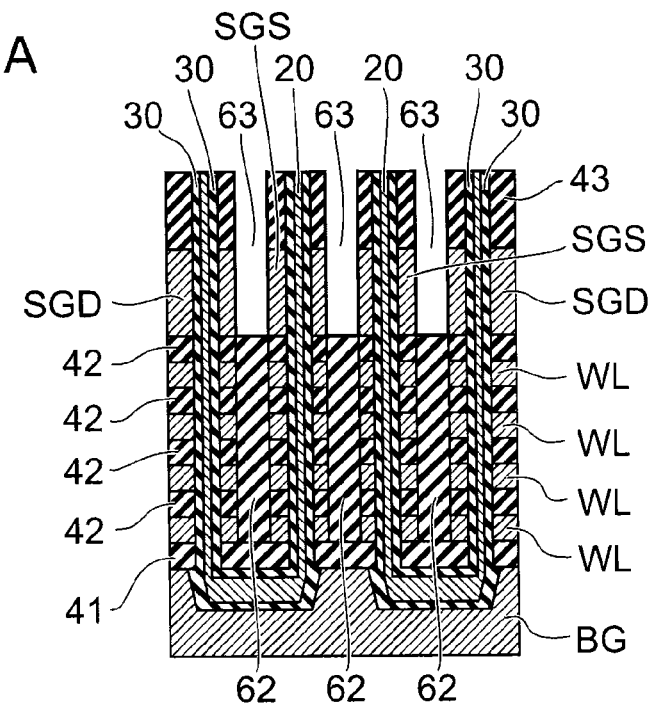
Figure 8B:
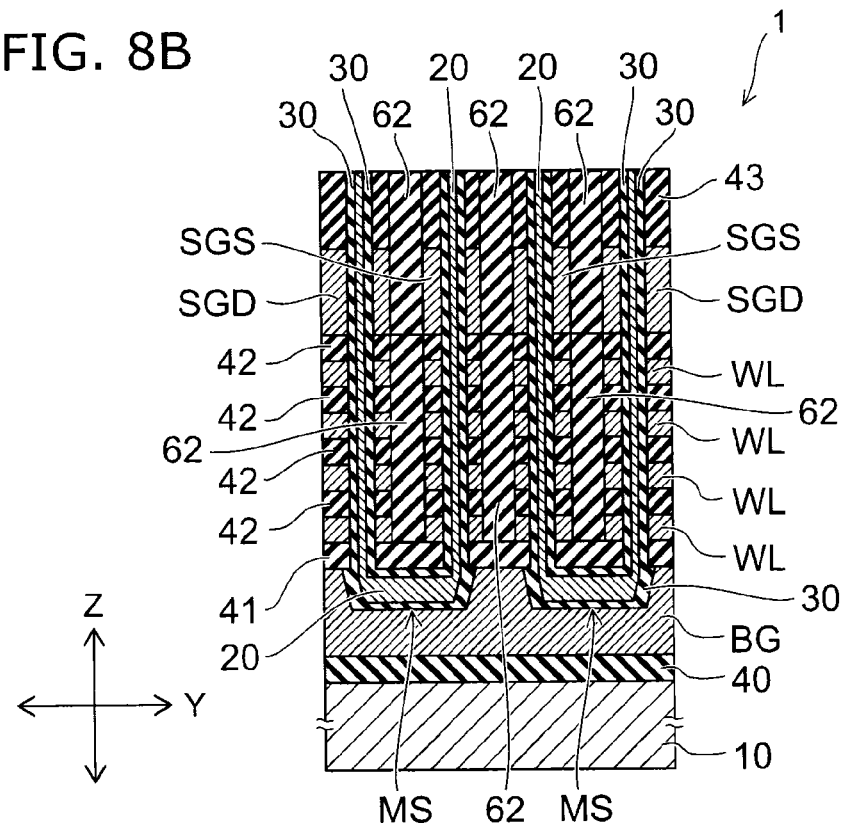

FIG. 8B is a schematic cross-sectional view of the memory cell array 1. FIG. 8B shows a cross section parallel to the YZ plane in FIG. 2.

The memory cell array 1 includes a plurality of memory strings MS. One memory string MS is formed in a U-shaped configuration including a pair of columnar portions CL and a joining portion JP joining the lower ends of the pair of columnar portions CL.

Figure 3:
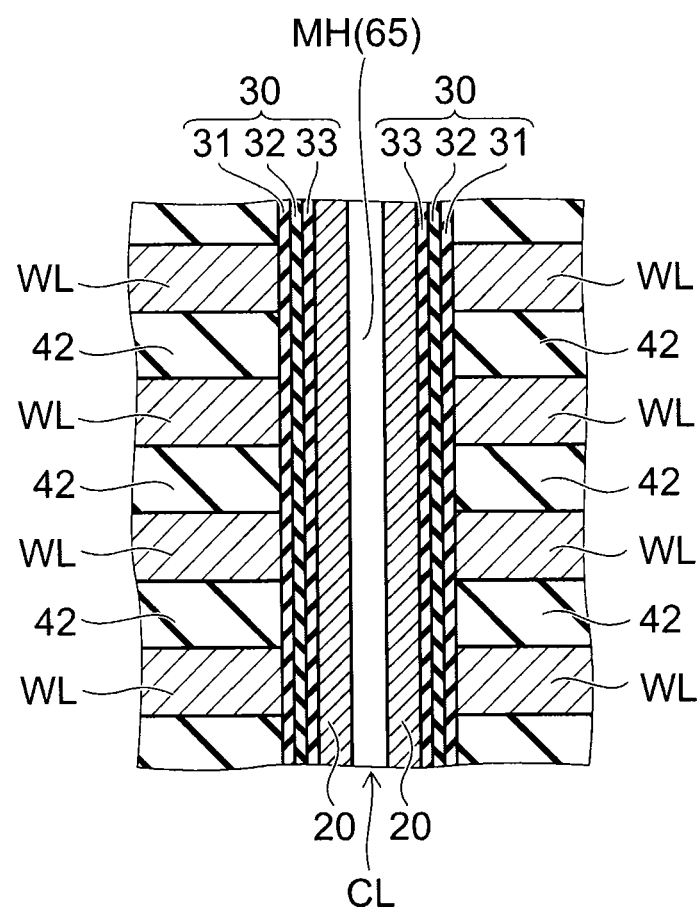
FIG. 3 is an enlarged cross-sectional view of a part in FIG. 2.

FIG. 3 shows an enlarged cross-sectional view of the columnar portion CL of the memory string MS.

A back gate BG is provided on the substrate 10 via an insulating film 40. The back gate BG is a conductive film, and is, for example, a silicon film doped with an impurity.

An insulating film 41 is provided on the back gate BG. An electrode film WL as a first conductive film and a first insulating film (hereinafter, referred to as simply an insulating film) 42 (shown in FIG. 3) are alternately stacked in plural on the insulating film 41. The insulating film 42 is provided between an electrode film WL and an electrode film WL. The number of electrode films WL is not limited to four shown in FIG. 8B but is arbitrary.

The electrode film WL is, for example, a polysilicon film doped with an impurity. Alternatively, for example, a nickel silicide film, a cobalt silicide film, a titanium silicide film, a tungsten silicide film, a tungsten film, a titanium nitride film, a titanium film, an aluminum film, and the like may be used as the electrode film WL.

The insulating film 42 is, for example, a silicon oxide film. Alternatively, for example, a silicon nitride film, an aluminum oxide film, an aluminum nitride film, a titanium oxide film, a tungsten oxide film, and the like may be used as the insulating film 42.

A drain-side select gate SGD is provided in an end portion of one of the pair of columnar portions CL of the U-shaped memory string MS, and a source-side select gate SGS is provided in an end portion of the other of the pair of columnar portions CL. The drain-side select gate SGD and the source-side select gate SGS are provided on the uppermost electrode film WL via the insulating film 42. The drain-side select gate SGD and the source-side select gate SGS are a conductive film, and are, for example, a polysilicon film doped with an impurity.

The drain-side select gate SGD and the source-side select gate SGS are divided in the Y direction by an insulating film 64 shown in FIG. 8B. The stacked body under the drain-side select gate SGD and the stacked body under the source-side select gate SGS are divided in the Y direction by an insulating film 62. Also the stacked body between adjacent memory strings MS is divided in the Y direction by the insulating film 62.

As shown in FIG. 2, a source line SL is provided on the source-side select gate SGS. The source line SL is, for example, a metal film. Bit lines BL that are a plurality of metal interconnections are provided on the drain-side select gate SGD and the source line SL. Each bit line BL extends in the Y direction.

In the following description, the drain-side select gate SGD and the source-side select gate SGS may not be distinguished, and may be collectively referred to as a select gate SG.

The memory string MS includes a channel body 20 provided in a U-shaped memory hole formed in the stacked body including the back gate BG, the plurality of electrode films WL, the plurality of insulating films 42, the drain-side select gate SGD, and the source-side select gate SGS.

The channel body 20 is provided in the U-shaped memory hole via a memory film 30. The channel body 20 is, for example, a silicon film. As shown in FIG. 3, the memory film 30 is provided between the inner wall (the side wall and the bottom wall) of the memory hole MH and the channel body 20.

Although FIG. 3 illustrates a structure in which the channel body 20 is provided such that a hollow portion remains on the central axis side of the memory hole MH, the entire space in the memory hole MH may be filled up with the channel body 20, or a structure in which an insulating film is buried in the hollow portion on the inside of the channel body 20 is possible.

The memory film 30 includes a block film 31, a charge storage film 32, and a tunnel film 33. The block film 31, the charge storage film 32, and the tunnel film 33 are provided in this order from the electrode film WL side between each electrode film WL and the channel body 20. The block film 31 is in contact with the electrode film WL, the tunnel film 33 is in contact with the channel body 20, and the charge storage film 32 is provided between the block film 31 and the tunnel film 33.

The channel body 20 functions as a channel in a memory cell, the electrode film WL functions as a control gate, and the charge storage film 32 functions as a data memory layer that stores a charge injected from the channel body 20. That is, a memory cell with a structure in which the control gate surrounds the periphery of the channel is formed at the intersection between the channel body 20 and each electrode film WL.

The semiconductor device of the embodiment is a nonvolatile semiconductor memory device that can perform the erasing and writing of data electrically in a free manner and can retain the memory content even when the power is turned off.

The memory cell is, for example, a charge trap memory cell. The charge storage film 32 includes a large number of trap sites that trap a charge, and is a silicon nitride film, for example.

The tunnel film 33 is, for example, a silicon oxide film, and forms a potential barrier when a charge is injected from the channel body 20 into the charge storage film 32 or when the charge stored in the charge storage film 32 is diffused to the channel body 20.

The block film 31 is, for example, a silicon oxide film, and prevents the charge stored in the charge storage film 32 from diffusing to the electrode film WL.

The drain-side select gate SGD, the channel body 20, and the memory film 30 between them constitute a drain-side select transistor STD. Above the drain-side select gate SGD, the channel body 20 is connected to the bit line BL.

The source-side select gate SGS, the channel body 20, and the memory film 30 between them constitute a source-side select transistor STS. Above the source-side select gate SGS, the channel body 20 is connected to the source line SL.

The back gate BG, and the channel body 20 and the memory film 30 provided in the back gate BG constitute a back gate transistor BGT.

The memory cell using each electrode film WL as the control gate is provided in plural between the drain-side select transistor STD and the back gate transistor BGT. Similarly, the memory cell using each electrode film WL as the control gate is provided in plural also between the back gate transistor BGT and the source-side select transistor STS.

The plurality of memory cells, the drain-side select transistor STD, the back gate transistor BGT, and the source-side select transistor STS are connected in series via the channel body 20, and constitute one U-shaped memory string MS. The memory string MS is arranged in plural in the X direction and the Y direction; thus, a plurality of memory cells are provided three-dimensionally in the X direction, the Y direction, and the Z direction.

Each of the plurality of conductive films including the back gate BG and the electrode film WL in the memory cell array 1 is connected to a circuit interconnection via the staircase-like contact unit 50.

Figure 4A:
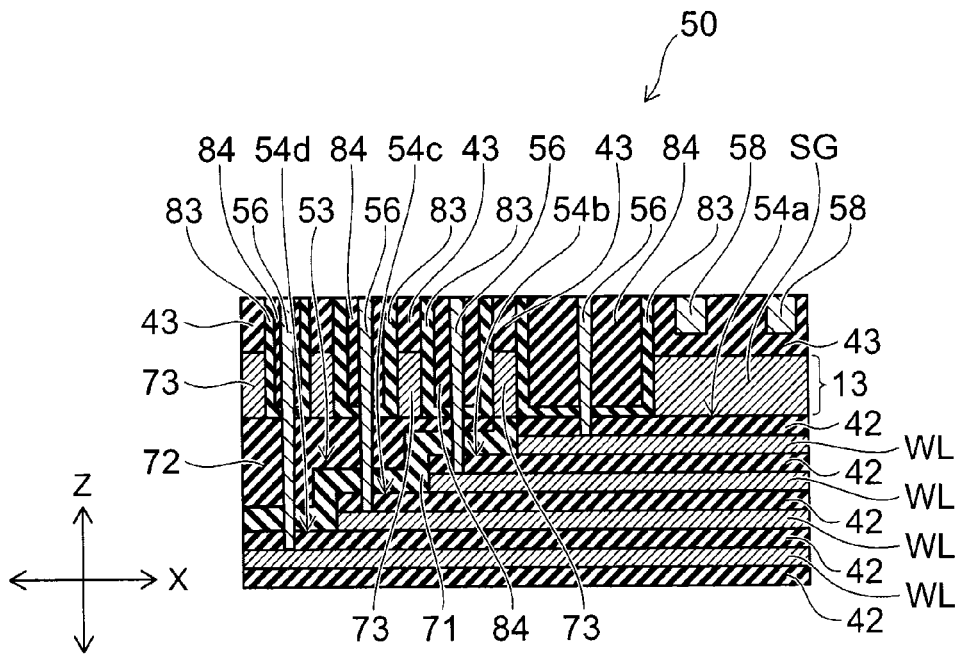
FIGS. 4A and 4B are schematic views of the staircase-like contact unit in the semiconductor device according to the embodiment.
Figure 4B:
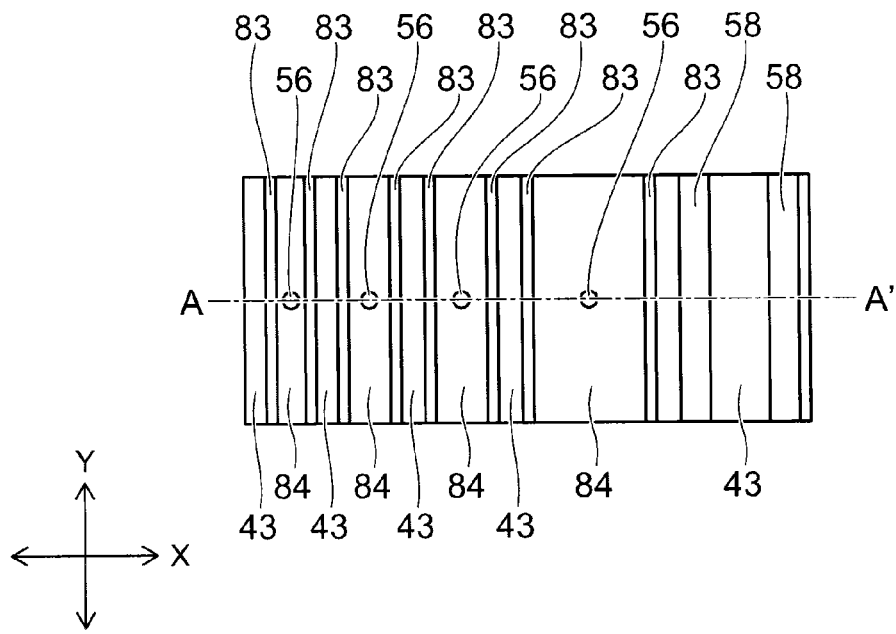

FIG. 4A is a schematic cross-sectional view of the staircase-like contact unit 50 of the embodiment, and FIG. 4B is a schematic plan view of the staircase-like contact unit 50. FIG. 4A corresponds to the A-A' cross section in FIG. 4B.

The stacked body including the plurality of electrode films WL and the plurality of insulating films 42 on the substrate 10 is provided also in the staircase-like contact unit 50. Also in the staircase-like contact unit 50, similarly to the memory cell array 1 shown in FIG. 8B, a conductive film corresponding to the back gate BG is provided on the substrate 10 via the insulating film 40; they are omitted in FIG. 4B. The number of stacked electrode films WL is not limited to that illustrated but is arbitrary.

FIG. 4A shows the staircase-like contact unit 50 for, for example, the upper four electrode films WL out of the plurality of electrode films WL. Also the electrode film WL and the back gate BG below the electrode films WL shown in FIG. 4A are individually connected to corresponding vias in a region on the left side in the X direction in FIG. 4A.

The stacked body including the plurality of insulating films 42 and the plurality of electrode films WL (a first stacked body) is formed also in a region on the outside in the X direction of the central region of the chip in which the memory cell array 1 in FIG. 1 is formed. The staircase-like contact unit 50 is provided in that region.

In the staircase-like contact unit 50, the electrode films WL and the insulating films 42 are fashioned in a staircase configuration along the X direction. That is, a plurality of stairs 54a to 54d are formed in the staircase-like contact unit 50.

The heights of the upper surfaces of the plurality of stairs 54a to 54d from the upper surface of the substrate 10 are different from one another. Each of the plurality of stairs 54a to 54d includes one electrode film WL and one insulating film 42 provided thereon.

The staircase region including the stairs 54b to 54d below the uppermost stair 54a is shown as a staircase region 53. A stopper film 71 made of a different material from the insulating film 42 is provided on the staircase region 53. The insulating film 42 is, for example, a silicon oxide film, and the stopper film 71 is, for example, a silicon nitride film.

The stopper film 71 covers the upper surfaces and the end portions of the stairs 54b to 54d. The stopper film 71 covers the end portion of the uppermost stair 54a.

An interlayer insulating film 72 made of a different material from the stopper film 71 is provided on the stopper film 71. The interlayer insulating film 72 is, for example, a silicon oxide film. The interlayer insulating film 72 fills the level difference among the plurality of stairs 54a to 54d, and the upper surface of the interlayer insulating film 72 is made flat.

Taking the upper surface of the substrate 10 as a reference, the height of the upper surface of the interlayer insulating film 72 is almost the same as the height of the upper surface of the uppermost stair 54a (the height of the upper surface of the uppermost insulating film 42). That is, a flat surface is formed from the upper surface of the interlayer insulating film 72 to the upper surface of the insulating film 42 of the uppermost stair 54a.

On the flat surface, a second stacked body including a conductive film (second conductive film) 13 and an insulating film (second insulating film) 43 provided on the conductive film 13 is provided.

The conductive film 13 is, for example, a polysilicon film doped with an impurity. The thickness of the conductive film 13 is thicker than the thickness of one electrode film WL.

The conductive film 13 is divided into a select gate SG on the uppermost stair 54a and a wall portion 73 above the staircase region 53 below the uppermost stair 54a.

Also the insulating film 43 on the conductive film 13 is divided into an insulating film 43 on the select gate SG and an insulating film 43 on the wall portion 73.

The select gate SG is connected to the drain-side select gate SGD or the source-side select gate SGS of the memory cell array 1.

A plurality of wall portions 73 are provided on the staircase region 53. The plurality of wall portions 73 are divided from one another in the X direction. Also the insulating films 43 on the wall portions 73 are divided in the X direction.

The wall portion 73 and the insulating film 43 on the wall portion 73 are formed as a line pattern extending in the Y direction as shown in FIG. 4B.

An insulating film (third insulating film) 83 and an insulating film (fourth insulating film) 84 made of a different material from the insulating film 83 are provided between adjacent wall portions 73 and between adjacent insulating films 43. For example, the insulating film 83 is a silicon nitride film, and the insulating film 84 is a silicon oxide film.

The insulating film 83 is provided on the side wall of the wall portion 73 and the side wall of the insulating film 43 on the wall portion 73. The insulating film 83 is provided also on the interlayer insulating film 72 between adjacent wall portions 73. The insulating film 84 is provided on the inside of the insulating film 83.

The insulating film 83 and the insulating film 84 are provided also between the select gate SG and the wall portion 73. The insulating film 83 and the insulating film 84 are provided also between the insulating film 43 on the select gate SG and the insulating film 43 on the wall portion 73.

The insulating film 83 is provided on the side wall on the staircase region 53 side of the select gate SG and the side wall on the staircase region 53 side of the insulating film 43 on the select gate SG. The insulating film 83 is provided also on the insulating film 42 of the uppermost stair 54a between the select gate SG and the wall portion 73.

The insulating film 84 is provided on the inside of the insulating film 83 provided between the select gate SG and the wall portion 73 and between the insulating film 43 on the select gate SG and the insulating film 43 on the wall portion 73.

Also the insulating film 83 and the insulating film 84 between the select gate SG and the wall portion 73 are formed as a line pattern extending in the Y direction as shown in FIG. 4B.

The upper surface of the insulating film 43 on the wall portion 73, the upper surface of the insulating film 83, the upper surface of the insulating film 84, and the upper surface of the insulating film 43 on the select gate SG are located at the same height from the upper surface of the substrate 10, and are made flat.

A plurality of vias 56 extending in the Z direction are provided in the stacked body on the stairs 54b to 54d in the staircase region 53.

Each via 56 penetrates through the insulating film 84 between a wall portion 73 and a wall portion 73, the insulating film 83 under the insulating film 84, the interlayer insulating film 72 under the insulating film 83, the stopper film 71 under the interlayer insulating film 72, and the insulating film 42 of each of the stairs 54b to 54d under the stopper film 71, and reaches the electrode film WL of each of the stairs 54b to 54d. Each via 56 is electrically connected to the electrode film WL of each corresponding one of the stairs 54b to 54d.

The via 56 includes, for example, a barrier metal (a first metal) and an embedding metal (a second metal). The barrier metal having the function of adhesion and metal diffusion prevention is formed on the inner wall (the side wall and the bottom wall) of a hole 55 shown in FIG. 17A described later, and the embedding metal excellent in burying condition is buried on the inside of the barrier metal. For example, titanium nitride may be used as the barrier metal, and tungsten may be used as the embedding metal.

The via 56 extending in the Z direction is provided also in the stacked body on the uppermost stair 54a. The via 56 penetrates through the insulating film 84 between the wall portion 73 and the select gate SG, the insulating film 83 under the insulating film 84, and the insulating film 42 under the insulating film 83, and reaches the electrode film WL of the uppermost stair 54a to be electrically connected to the electrode film WL of the uppermost stair 54a. The stopper film 71 and the interlayer insulating film 72 are not provided on the uppermost stair 54a.

The electrode film WL on each story of the staircase-like contact unit 50 is integrally connected to the electrode film WL on the same story of the memory cell array 1. Therefore, each electrode film WL of the memory cell array 1 is connected to a not-shown interconnection provided on the stacked body shown in FIG. 4A via the via 56 of the staircase-like contact unit 50.

Also the select gate SG is connected to an upper interconnection via a not-shown via in a not-shown region.

An upper via 58 is provided in the insulating film 43 on the select gate SG. The upper via 58 is a metal material buried in a trench formed in the insulating film 43. The upper via 58 does not reach the select gate SG. The upper via 58 is formed as a line pattern extending in the Y direction as shown in FIG. 4B. The upper via 58 is connected to a not-shown interconnection provided on the stacked body shown in FIG. 4A.

The upper interconnection connected to the vias 56 and 58 is connected to a circuit formed on the surface of the substrate 10 via a not-shown via formed in another region.

Next, a method for manufacturing a semiconductor device of the embodiment is described with reference to FIG. 5A to FIG. 17B.

First, a method for forming the memory cell array 1 is described.

Figure 5A:
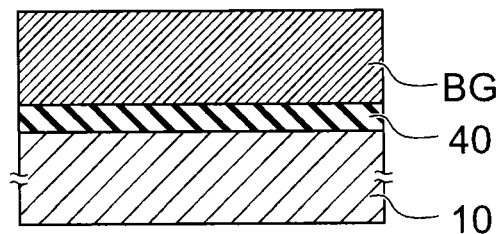
FIG. 5A to FIG. 8B are schematic cross-sectional views showing a method for manufacturing the memory cell array in the semiconductor device according to the embodiment.
Figure 5B:
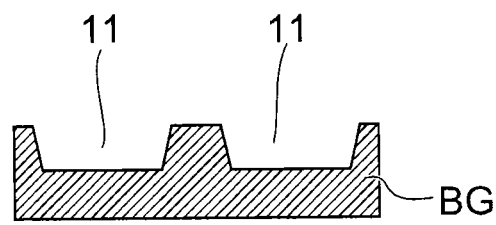

As shown in FIG. 5A, the back gate BG is formed on the substrate 10 via the insulating film (e.g. a silicon oxide film) 40. The back gate BG is a polysilicon film doped with, for example, boron (B). In FIG. 5B and the subsequent drawings, the illustration of the substrate 10 and the insulating film 40 is omitted.

A plurality of trenches 11 are formed in the back gate BG as shown in FIG. 5B by etching using a not-shown mask.

Figure 5C:
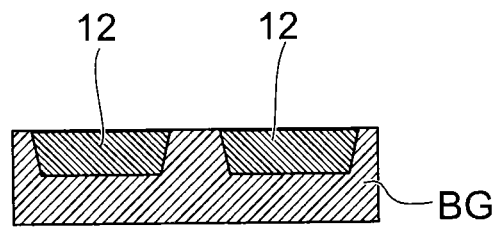

As shown in FIG. 5C, a sacrifice film 12 is buried in the trench 11. The sacrifice film 12 is, for example, a non-doped silicon film. The non-doped silicon film is a silicon film to which an impurity for providing electrical conductivity is not intentionally added, and does not substantially contain impurities other than the elements resulting from the source gas in the film-formation.

Figure 6A:
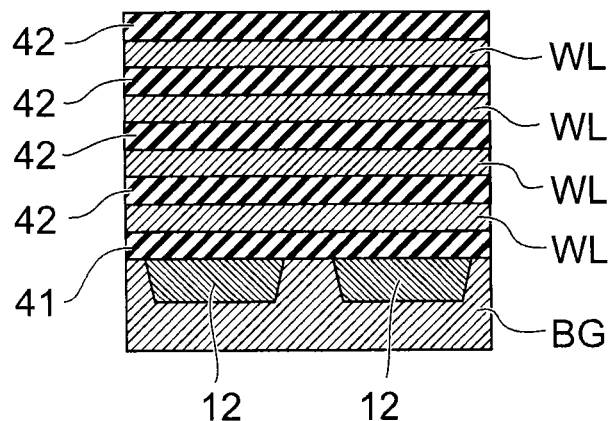

The upper surface of the protruding portion of the back gate BG between a trench 11 and a trench 11 is exposed. The upper surface of the protruding portion of the back gate BG and the upper surface of the sacrifice film 12 are made flat surfaces flush with each other. The insulating film 41 is formed on the flat surface as shown in FIG. 6A. The insulating film 41 is, for example, a silicon oxide film.

The electrode film WL and the insulating film 42 are alternately stacked in plural on the insulating film 41. The electrode WL is a polysilicon film doped with, for example, boron (B) as an impurity. The insulating film 42 is, for example, a silicon oxide film.

Figure 6B:
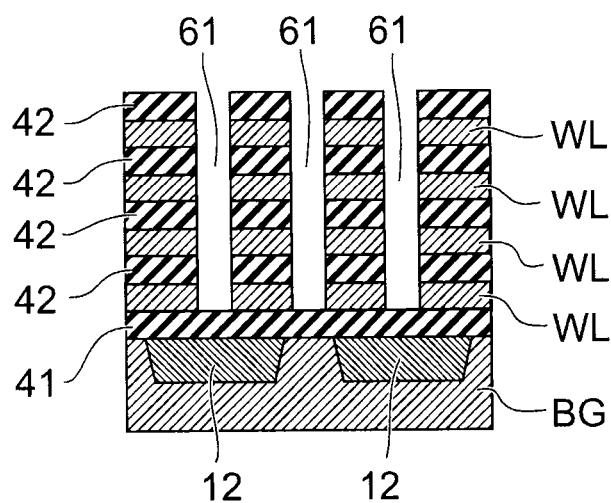

After the first stacked body including the plurality of electrode films WL and the plurality of insulating films 42 is formed, photolithography and etching are performed to form a plurality of trenches 61 that divide the first stacked body and reach the insulating film 41, as shown in FIG. 6B. The trench 61 divides the first stacked body on the sacrifice film 12 and on a portion between adjacent sacrifice films 12.

Figure 7A:
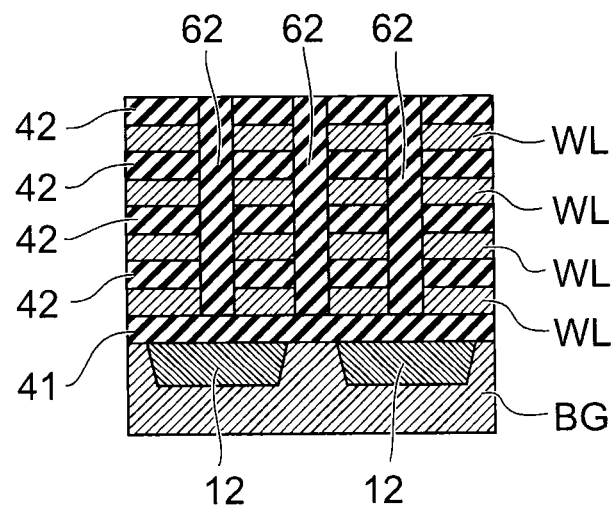

As shown in FIG. 7A, the insulating film 62 is buried in the trench 61. The insulating film 62 is, for example, a silicon oxide film or a silicon nitride film.

Although the insulating film 62 is deposited also on the uppermost insulating film 42 of the first stacked body, the insulating film 62 on the insulating film 42 is removed and the insulating film 42 is exposed. The upper surface of the insulating film 42 and the upper surface of the insulating film 62 are made flat in a flush manner.

Figure 7B:
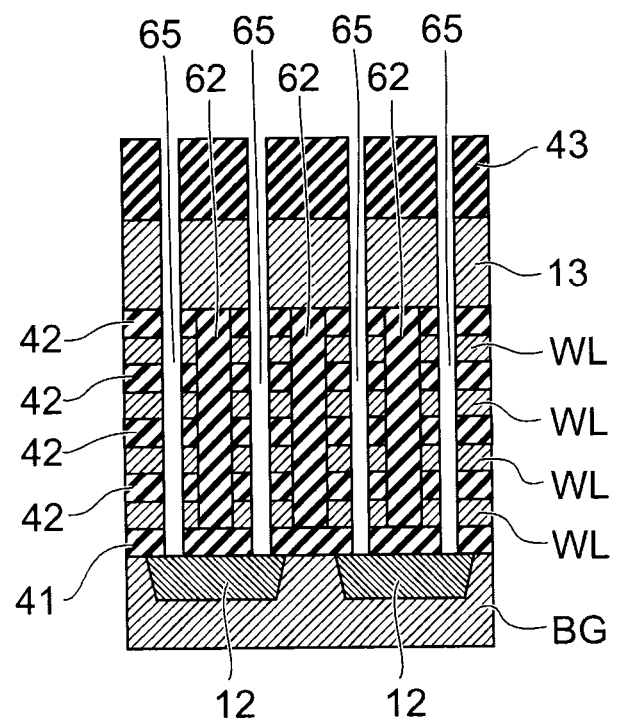

As shown in FIG. 7B, the second stacked body including the conductive film 13 and the insulating film 43 is formed on the uppermost insulating film 42 and on the insulating film 62. The conductive film 13 forms the drain-side select gate SGD or the source-side select gate SGS, and is a polysilicon film doped with, for example, boron (B) as an impurity. The insulating film 43 is formed on the conductive film 13.

The back gate BG and the films on the back gate BG described above are formed by, for example, the CVD (chemical vapor deposition) method.

After the insulating film 43 is formed, a plurality of holes 65 that penetrate through the second stacked body and the first stacked body mentioned above are formed as shown in FIG. 7B. The hole 65 is formed by, for example, the RIE (reactive ion etching) method using a not-shown mask.

The bottom of the hole 65 reaches the sacrifice film 12, and the sacrifice film 12 is exposed at the bottom of the hole 65. A pair of holes 65 are formed on one sacrifice film 12, with the insulating film 62 located between the holes 65. The insulating film 43, the conductive film 13, the insulating film 42, and the electrode WL are exposed at the side wall of the hole 65.

After the hole 65 is formed, the sacrifice film 12 is removed using, for example, an alkaline etchant. The sacrifice film 12 is removed via the hole 65. By the removal of the sacrifice film 12, the trench 11 appears which has been formed in the back gate BG in the process shown in FIG. 5B. The bottoms of a pair of holes 65 are connected to one common trench 11 to form one U-shaped memory hole.

The memory film 30 is formed on the inner wall of the memory hole as shown in FIG. 8A and FIG. 3. Further, the channel body 20 is formed on the inside of the memory film 30 in the memory hole.

After that, a trench 63 that penetrates through the second stacked body is formed to divide the conductive film 13 into the drain-side select gate SGD and the source-side select gate SGS. The insulating film 64 is buried in the trench 63 as shown in FIG. 8B. The insulating film 64 is a silicon oxide film or a silicon nitride film.

Next, a method for forming the staircase-like contact unit 50 is described.

Figure 9A:
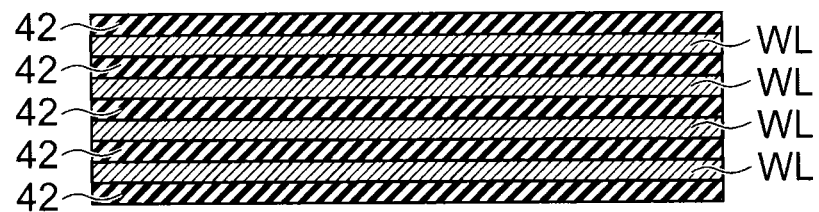
FIG. 9A to FIG. 17B are schematic cross-sectional views showing a method for manufacturing the staircase-like contact unit in the semiconductor device according to the embodiment.

Also in the region on the substrate 10 where the staircase-like contact unit 50 will be formed, as shown in FIG. 9A, a stacked body including a plurality of electrode films WL and a plurality of insulating films 42 (the first stacked body) is formed similarly to the memory cell array 1.

FIG. 9A shows a portion including, for example, the upper four electrode films WL in the region of the first stacked body where the staircase-like contact unit will be formed.

Figure 9B:
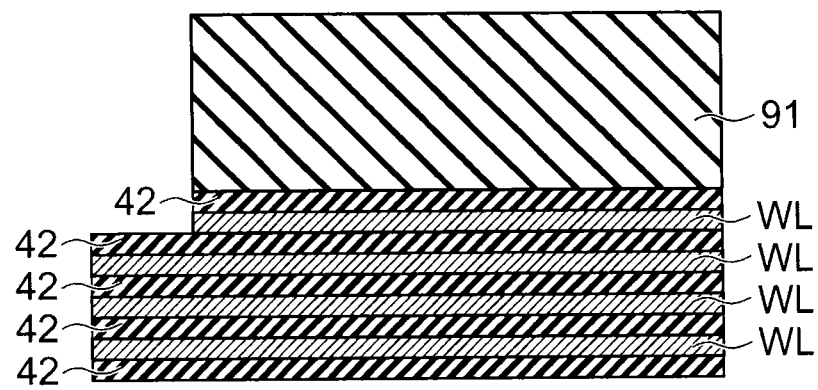

In the region where the staircase-like contact unit will be formed, a resist film 91 shown in FIG. 9B is formed on the first stacked body, and exposure and development are performed on the resist film 91 to pattern the resist film 91.

Then, the resist film 91 is used as a mask to perform, for example, the RIE method to etch the first stacked body. First, the highest insulating film 42 and the highest electrode film WL in the portion exposed from the resist film 91 are removed as shown in FIG. 9B.

Figure 9C:
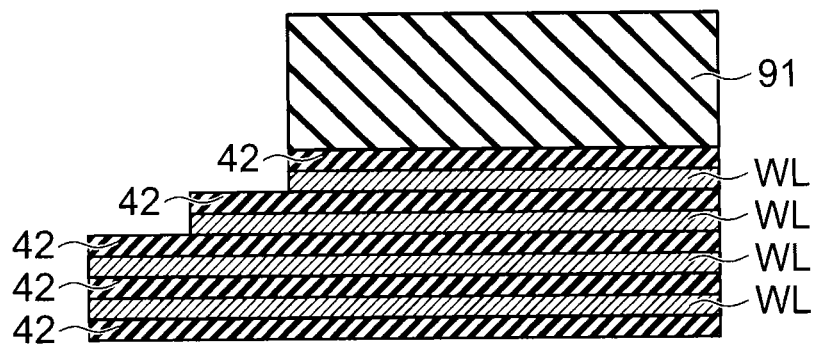

Next, ashing processing using an oxygen-containing gas, for example, is performed on the resist film 91. Thereby, as shown in FIG. 9C, the resist film 91 is isotropically etched, and the region exposed from the resist film 91 of the first stacked body is expanded.

The slimmed resist film 91 is used as a mask to further perform RIE on the first stacked body. Also at this time, the highest insulating film 42 and the highest electrode film WL in the portion exposed from the resist film 91 are removed.

Also in the portion already etched by the RIE previously performed, another insulating film 42 and another electrode film WL are etched and removed.

After that, similarly, slimming is performed on the resist film 91, and the slimmed resist film 91 is used as a mask to etch still another insulating film 42 and still another electrode film WL.

The slimming of the resist film 91 and the etching of one insulating film 42 and one electrode film WL are repeated at times corresponding to the number of electrode films WL.

Figure 10A:
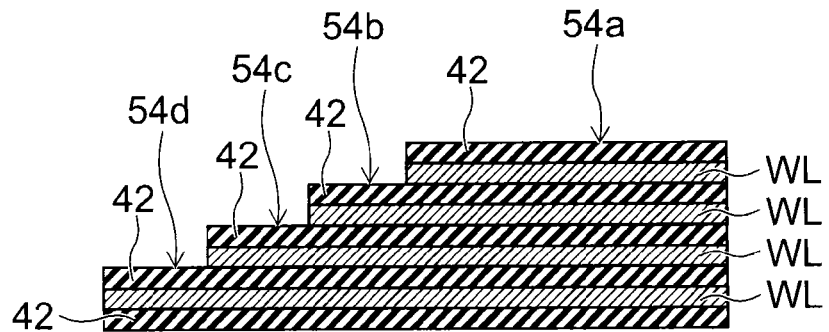

Then, the resist film 91 is removed, and the plurality of stairs 54a to 54d are formed in the first stacked body as shown in FIG. 10A. The upper surfaces of the stairs 54a to 54d are the insulating films 42.

Figure 10B:
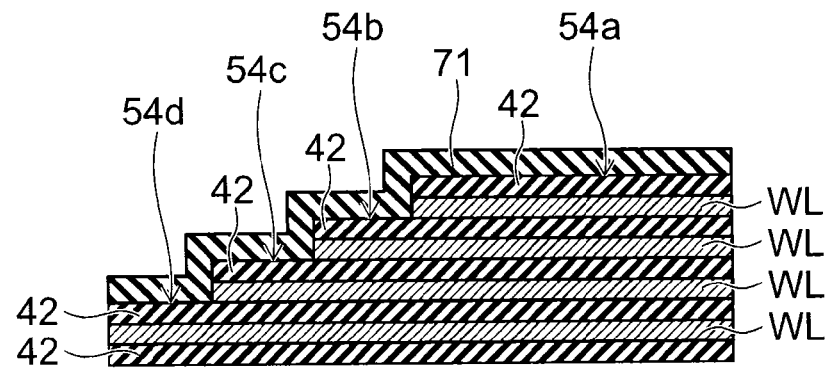

After the first stacked body is fashioned into a staircase configuration, as shown in FIG. 10B, the stopper film 71 is formed on the stairs 54a to 54d. The stopper film 71 covers the upper surfaces and the end portions of the stairs 54a to 54d. The stopper film 71 is formed conformally along the staircase configuration of the stairs 54a to 54d, and also the surface of the stopper film 71 is formed in a staircase configuration. The stopper film 71 is, for example, a silicon nitride film formed by the CVD method, and is made of a different material from the insulating film 42, which is a silicon oxide film.

Figure 10C:
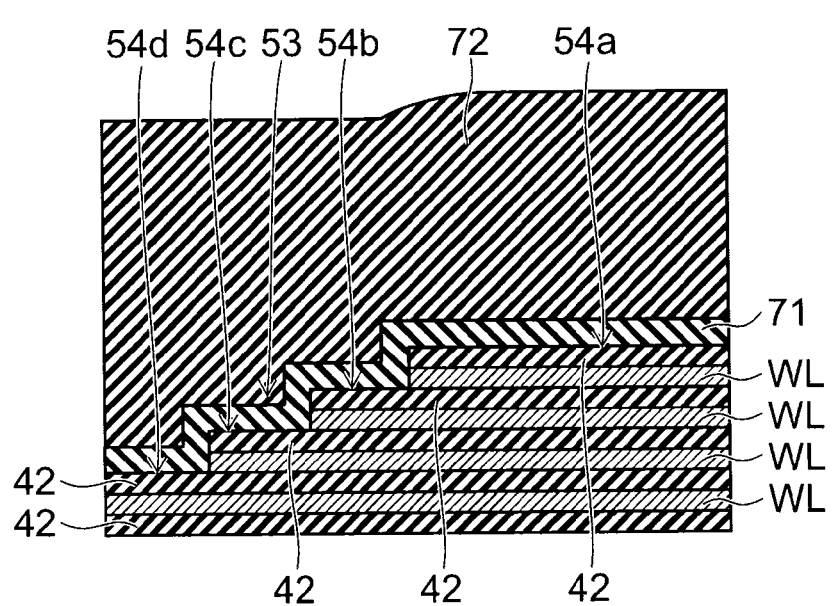

As shown in FIG. 10C, the interlayer insulating film 72 is formed on the stopper film 71. The interlayer insulating film 72 is, for example, a silicon oxide film, which is a different material from the stopper film 71. The interlayer insulating film 72 is formed thicker than the stopper film 71, and fills the level difference among the plurality of stairs 54a to 54d.

After the interlayer insulating film 72 is formed, the upper surface of the interlayer insulating film 72 is ground by the CMP (chemical mechanical polishing) method. The stopper film 71 made of a different material from the interlayer insulating film 72 functions as a stopper for detecting the end point of the CMP.

The CMP is performed until the upper surface of the stopper film 71 on the uppermost stair 54a becomes exposed. Thus, the height of the upper surface of the interlayer insulating film 72 is recessed at least to the upper surface of the stopper film 71 on the uppermost stair 54a.

Figure 11A:
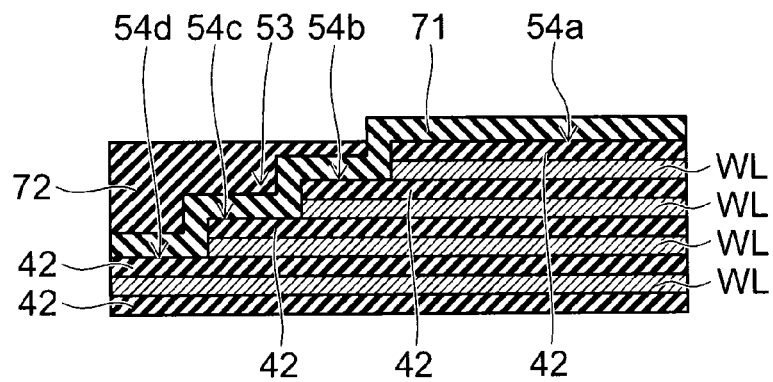

Even after the polishing pad has arrived at the stopper film 71, the interlayer insulating film 72 is still over-ground slightly, and as shown in FIG. 11A, the upper surface of the interlayer insulating film 72 tends to sink below the upper surface of the stopper film 71 on the uppermost stair 54a.

Figure 11B:
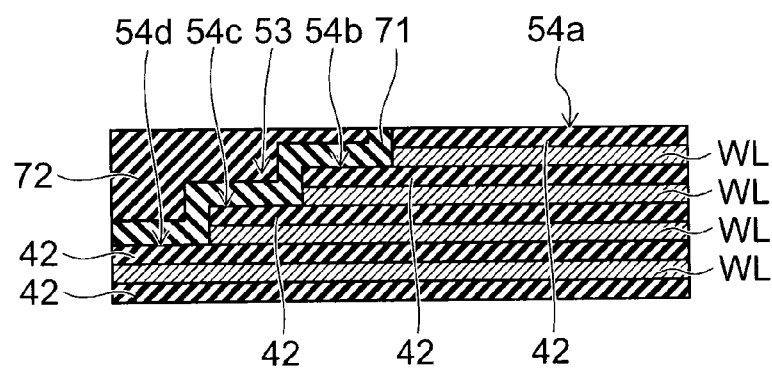

Next, the stopper film 71 on the uppermost stair 54a is removed by etching (e.g. RIE). Thereby, as shown in FIG. 11B, the upper surface of the uppermost stair 54a (the upper surface of the insulating film 42) and the upper surface of the interlayer insulating film 72 are planarized almost flatly.

The interlayer insulating film 72 is not left on the uppermost stair 54a, and is provided on the staircase region 53 including the stairs 54b to 54d on the lower side of the uppermost stair 54a. Also the stopper film 71 is not left on the uppermost stair 54a, and is provided on the staircase region 53 including the stairs 54b to 54d on the lower side of the uppermost stair 54a.

Figure 11C:
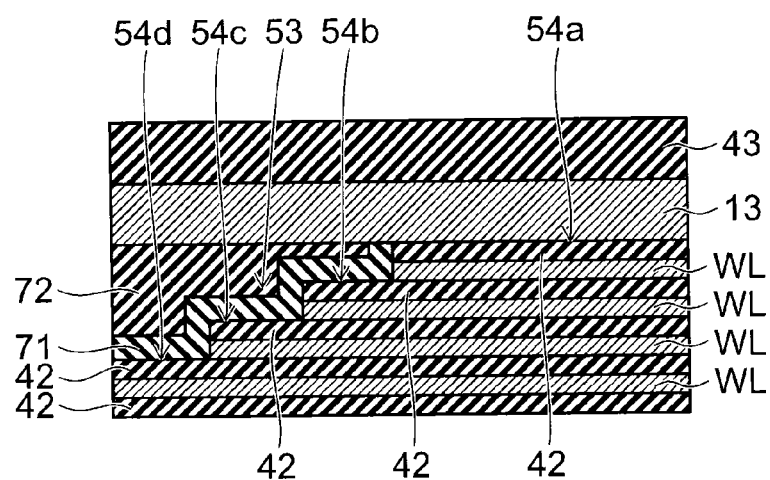

On the planarized interlayer insulating film 72 and on the uppermost stair 54a, the second stacked body including the conductive film 13 and the insulating film 43 is formed as shown in FIG. 11C. The conductive film 13 is formed on the interlayer insulating film 72 and on the uppermost stair 54a, and the insulating film 43 is formed on the conductive film 13.

The conductive film 13 is a silicon film containing an impurity, and is thicker than one electrode film WL. The insulating film 43 is a silicon oxide film.

In the region where the memory cell array 1 is formed, the conductive film 13 forms the drain-side select gate SGD or the source-side select gate SGS. Since the stopper film 71 and the interlayer insulating film 72 are not provided on the uppermost stair 54a in the region where the staircase-like contact unit 50 is formed, the possibility is reduced that the channel resistance will be increased due to the increase of the distance between the select gate SG (the drain-side select gate SGD or the source-side select gate SGS) and the memory cell in the memory cell array 1.

Figure 12A:
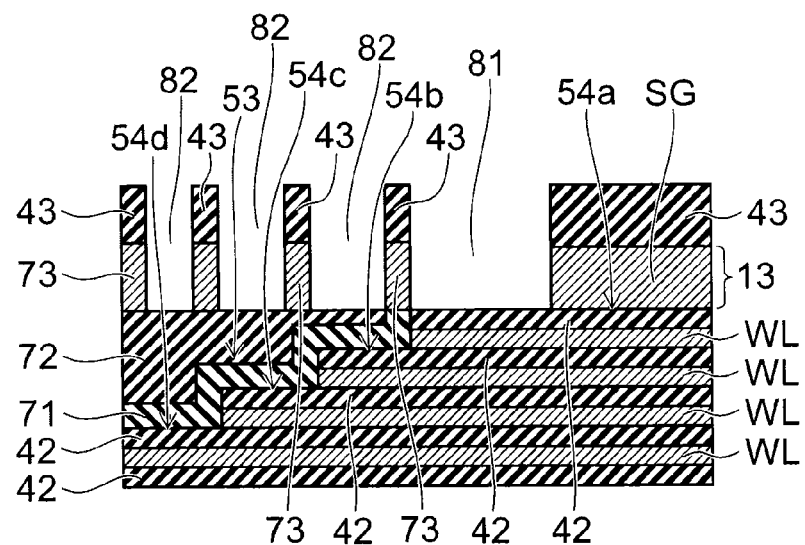

The conductive film 13 is divided into the select gate SG on the uppermost stair 54a and a plurality of wall portions 73 above the staircase region 53 below the uppermost stair 54a, as shown in FIG. 12A. Also the insulating film 43 on the conductive film 13 is divided into the insulating film 43 on the select gate SG and the insulating films 43 on the wall portions 73.

Figure 12B:
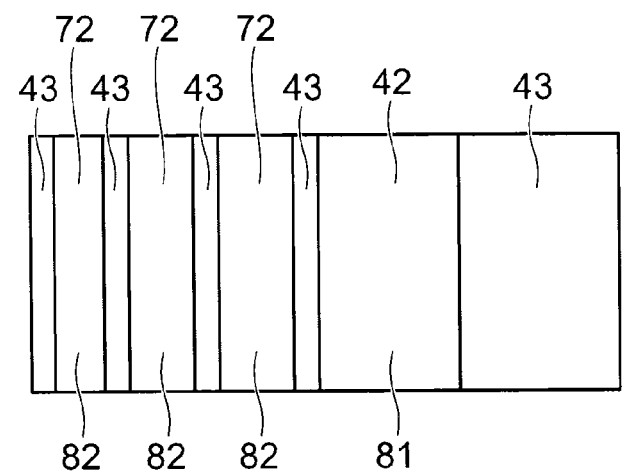

As shown in FIG. 12B corresponding to the top view of FIG. 12A, the insulating film 43 and the conductive film 13 under it are patterned into a line-and-space pattern.

A space portion 82 is formed between adjacent wall portions 73 and between adjacent insulating films 43 on wall portions 73. The interlayer insulating film 72 is exposed at the bottom of the space portion 82.

A space portion 81 is formed between the select gate SG and the wall portion 73 and between the insulating film 43 on the wall portion 73 and the insulating film 43 on the select gate SG. The insulating film 42 of the uppermost stair 54a is exposed at the bottom of the space portion 81.

The space portions 82 on the staircase region 53 are formed individually on the stairs 54b to 54d in the staircase region 53.

Figure 13A:
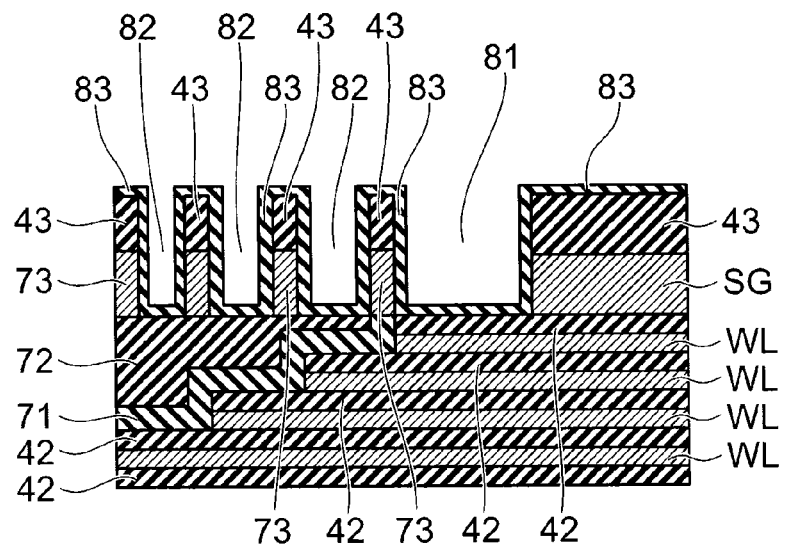
Figure 13B:
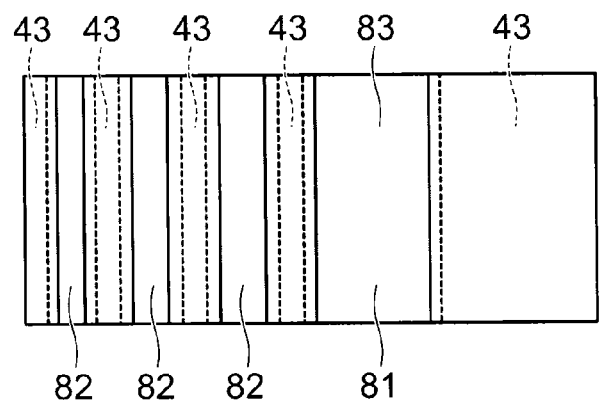

In the space portion 82 and in the space portion 81, the insulating film (third insulating film) 83 is formed as shown in FIG. 13A and FIG. 13B that is the top view thereof. The insulating film 83 is formed conformally on the upper surface of the insulating film 43, on the side wall of the insulating film 43, on the side wall of the wall portion 73, on the side wall of the select gate SG, on the interlayer insulating film 72 at the bottom of the space portion 82, and on the insulating film 42 at the bottom of the space portion 81.

The insulating film 83 is, for example, a silicon nitride film, which is a different material from the interlayer insulating film 72, the insulating film 43, and the insulating film 42.

Figure 14A:
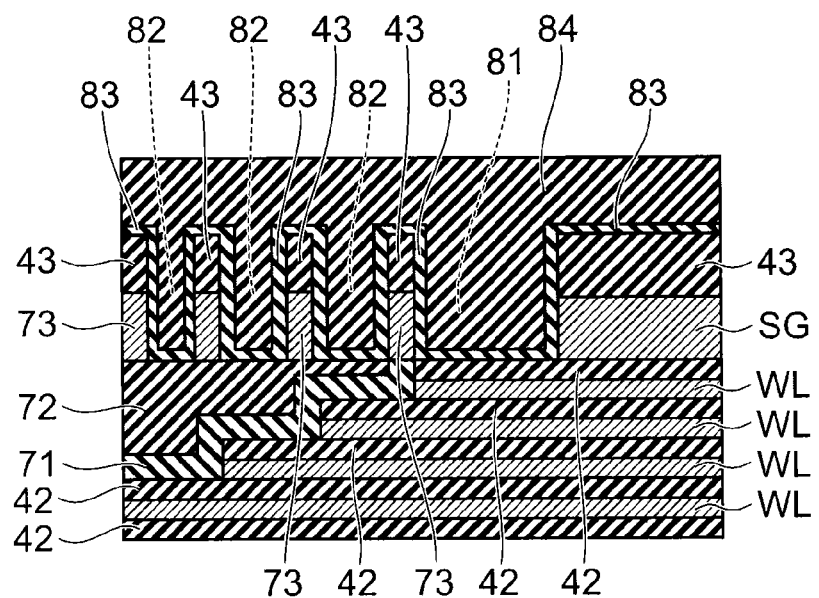
Figure 14B:
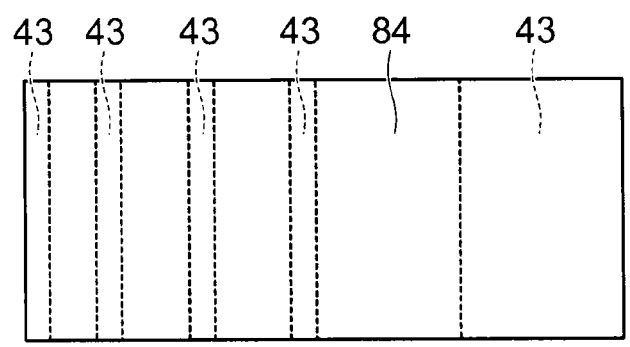

On the inside of the insulating film 83 in the space portion 82 and on the inside of the insulating film 83 in the space portion 81, the insulating film (fourth insulating film) 84 is formed as shown in FIG. 14A and FIG. 14B that is the top view thereof.

The insulating film 84 fills the interior of the space portion 82 and the interior of the space portion 81, and is at the same time deposited above the opening ends of the space portions 81 and 82. The insulating film 84 is, for example, a silicon oxide film, which is a different material from the insulating film 83.

After the insulating film 84 is formed, the upper surface of the insulating film 84 is ground by the CMP method. The insulating film 83 made of a different material from the insulating film 84 functions as a stopper for detecting the end point of the CMP.

Figure 15A:
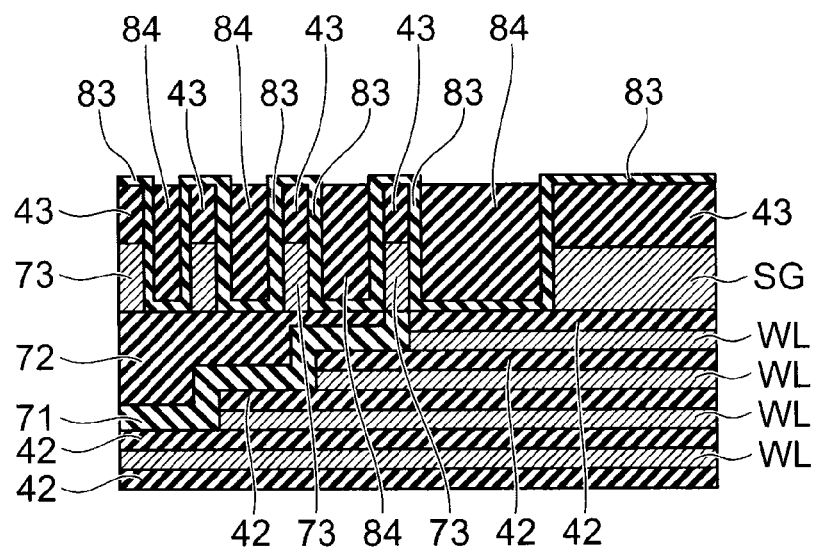
Figure 15B:
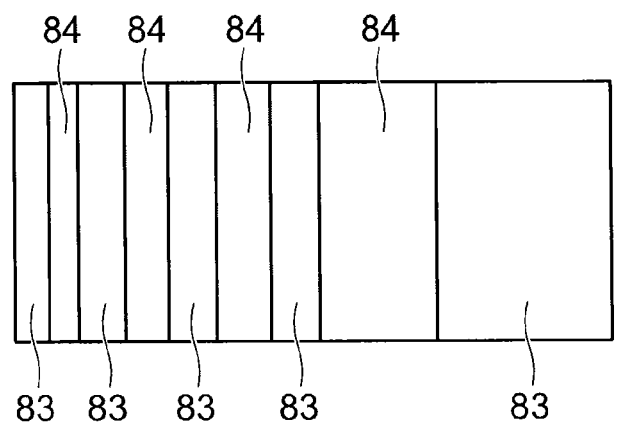

The CMP is performed until the upper surface of the insulating film 83 on the insulating film 43 becomes exposed, as shown in FIG. 15A and FIG. 15B that is the top view thereof. Thus, the height of the upper surface of the insulating film 84 is recessed at least to the upper surface of the insulating film 83 on the insulating film 43.

Even after the polishing pad has arrived at the insulating film 83 serving as a stopper, the insulating film 84 is still over-ground slightly, and the upper surface of the insulating film 84 tends to sink below the upper surface of the insulating film 83 on the insulating film 43 as shown in FIG. 15A.

Figure 16A:
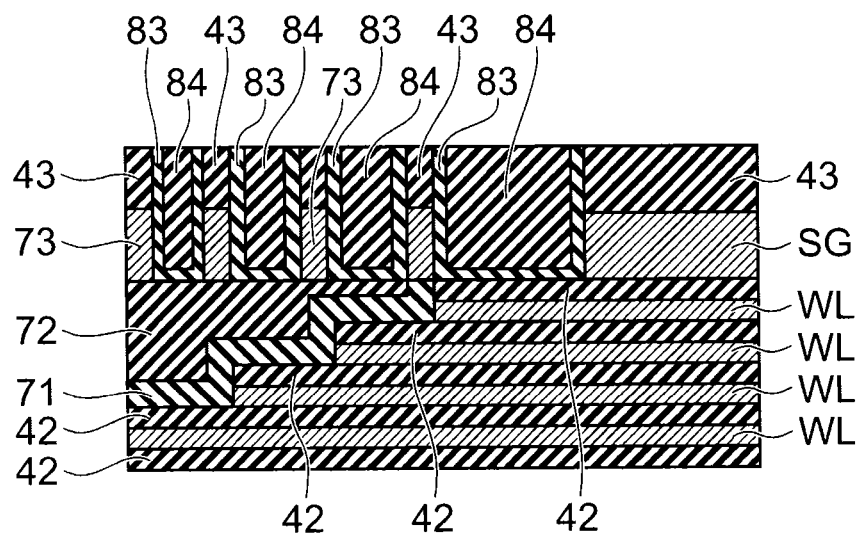
Figure 16B:
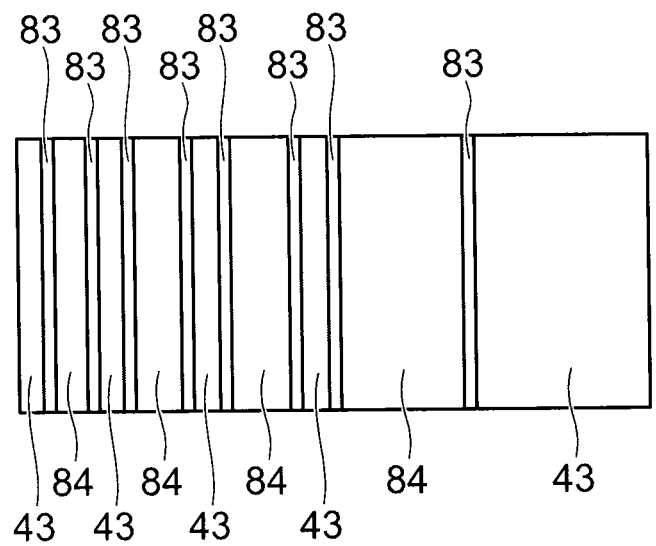

Next, the insulating film 83 on the insulating film 43 is removed by etching (e.g. RIE). Thereby, as shown in FIG. 16A and FIG. 16B that is the top view thereof, the upper surface of the insulating film 43, the upper surface of the insulating film 84, and the upper surface of the insulating film 83 are planarized almost flatly.

Figure 17A:
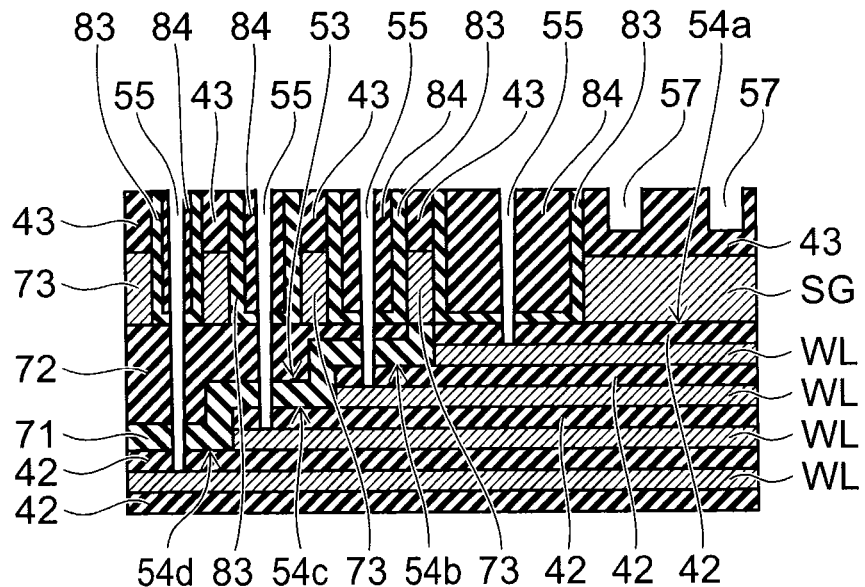
Figure 17B:
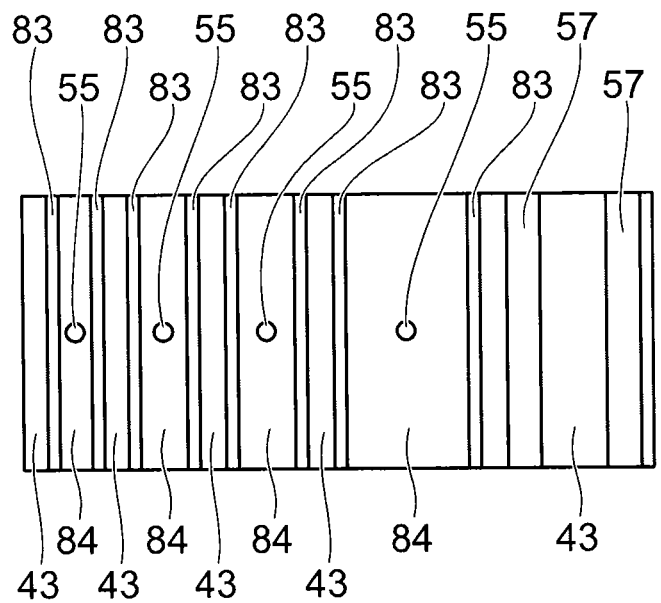

Next, as shown in FIG. 17A and FIG. 17B that is the top view thereof, a plurality of holes 55 that penetrate through the stacked films on the stairs 54b to 54d in the staircase region 53 are formed.

Each hole 55 penetrates through the insulating film 84, the insulating film 83 under the insulating film 84, the interlayer insulating film 72 under the insulating film 83, the stopper film 71 under the interlayer insulating film 72, and the insulating film 42 under the stopper film 71, and reaches the electrode film WL of each of the stairs 54b to 54d.

The plurality of holes 55 individually reaching the stairs 54b to 54d below the uppermost stair 54a are formed collectively and simultaneously by the RIE method using a not-shown mask.

The insulating film 84, the insulating film 83, the interlayer insulating film 72, the stopper film 71, and the insulating film 42 are sequentially etched. Since etching is performed on the stacked body in which films of different materials are alternately stacked, a lower film functions as an etching stopper in the etching of an upper film, and the difference in the processing rate between holes 55 can be relaxed.

Consequently, a hole 55 with a relatively shallow processing depth can be prevented from being excessively etched and piercing a lower conductive film WL that is not the connection object.

The hole 55 is formed also in the stacked films on the uppermost stair 54a. The hole 55 penetrates through the insulating film 84 provided between the select gate SG and the wall portion 73, the insulating film 83 under the insulating film 84, and the insulating film 42 under the insulating film 83, and reaches the electrode film WL of the uppermost stair 54a.

In each hole 55, the via 56 is buried as shown in FIGS. 4A and 4B. The electrode film WL on each story is connected to the via 56. The insulating film 84 and the insulating film 83 are provided between the via 56 and the wall portion 73, which is part of the conductive film 13, and the via 56 and the wall portion 73 are not connected. The insulating film 84 and the insulating film 83 are provided also between the via 56 and the select gate SG, and the via 56 and the select gate SG are not connected.

As shown in FIGS. 17A and 17B, a trench 57 is formed in the insulating film 43 on the select gate SG. In the trench 57, the via 58 is buried as shown in FIGS. 4A and 4B. The trench 57 is shallower than the upper surface of the select gate SG, and does not reach the select gate SG. Therefore, the via 58 buried in the trench 57 does not short-circuit with the select gate SG, and is connected to a not-shown upper interconnection.

Here, a method for forming a staircase-like contact unit of a comparative example is described with reference to FIG. 20A to FIG. 22B.

Figure 20A:
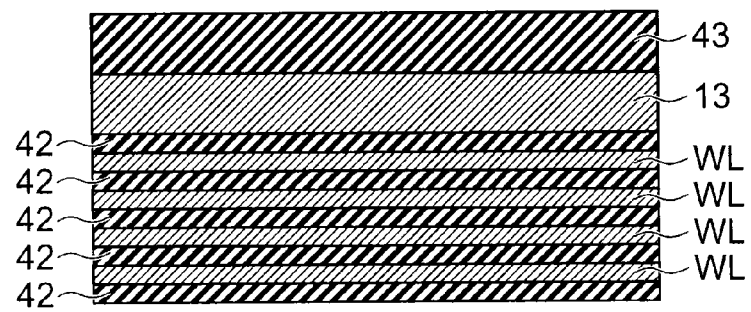
FIG. 20A to FIG. 22B are schematic views showing a method for manufacturing a staircase-like contact unit in a semiconductor device according to a comparative example.

In the comparative example, after the first stacked body including the plurality of electrode films WL and the plurality of insulating films 42 is formed, the fashioning for a staircase configuration is not performed, and the second stacked body including the conductive film 13 and the insulating film 43 is stacked on the first stacked body as shown in FIG. 20A.

Figure 20B:
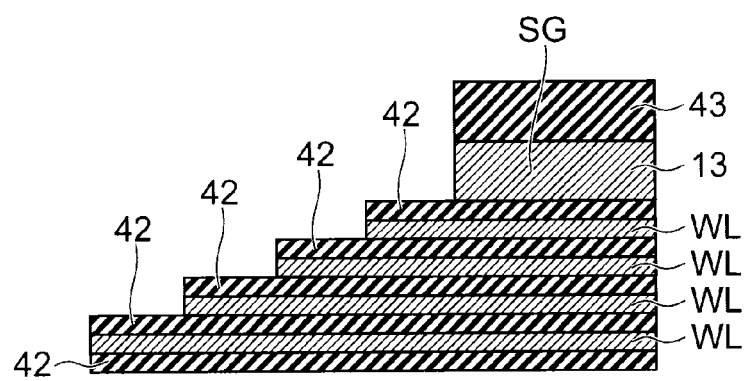

Then, a resist film (not shown) is formed on the insulating film 43, and similarly to the embodiment described above, the etching of the stacked body using the resist film as a mask and the sliming of the resist film are repeated to fashion the first stacked body into a staircase configuration as shown in FIG. 20B. The conductive film 13 is left as the select gate SG on the uppermost stair.

Figure 21A:
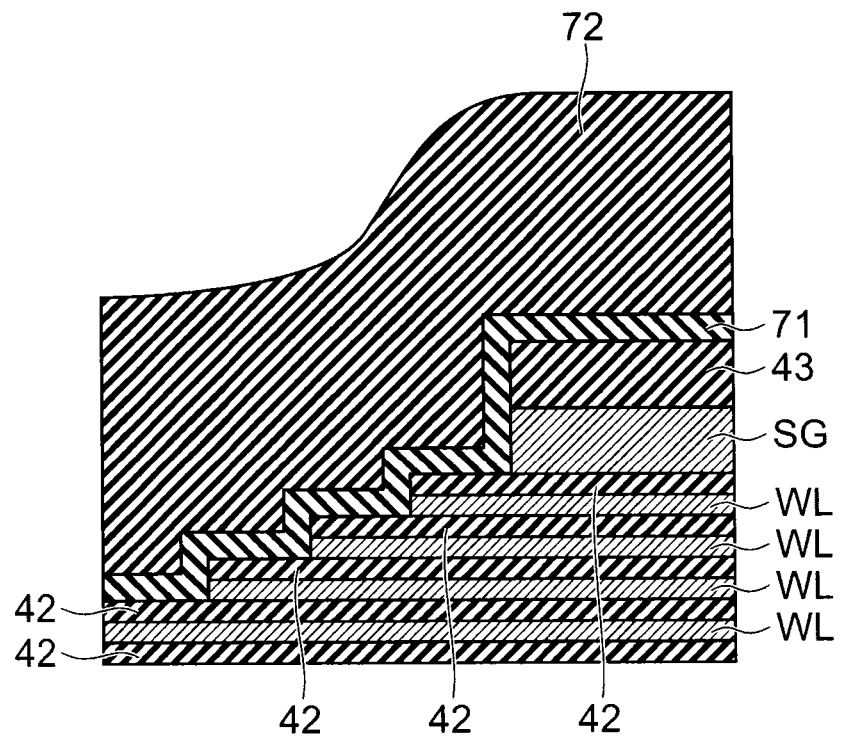

After the fashioning for a staircase configuration, as shown in FIG. 21A, the stairs are covered with the stopper film 71, and the interlayer insulating film 72 is formed on the stopper film 71.

Figure 21B:
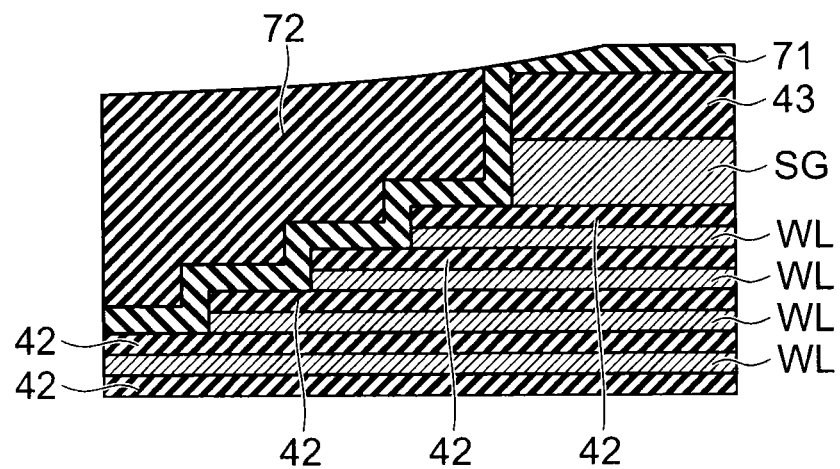

After the interlayer insulating film 72 is formed, the CMP method is used to grind the interlayer insulating film 72 until the stopper film 71 on the second stacked body including the select gate SG and the insulating film 43 becomes exposed, as shown in FIG. 21B.

The select gate SG is thicker than the electrode film WL, and a large level difference is likely to occur between the first stacked body and the second stacked body. Reflecting the level difference, as shown in FIG. 21A, a level difference is likely to occur also on the upper surface of the interlayer insulating film 72.

Due to the level difference formed on the upper surface of the interlayer insulating film 72, as shown in FIG. 21B, the stopper film 71 provided near the corner portion on the staircase region side of the insulating film 43 may be excessively ground by the CMP, and the stopper film 71 is likely to become thin in the excessively ground portion.

In particular, when the number of stacked electrode films WL is increased, the number of stairs is increased and the staircase region formed in the first stacked body lies over a very large area. Also planarizing the interlayer insulating film 72 formed over such a large area promotes the excessive grinding of the stopper film 71.

Figure 22A:
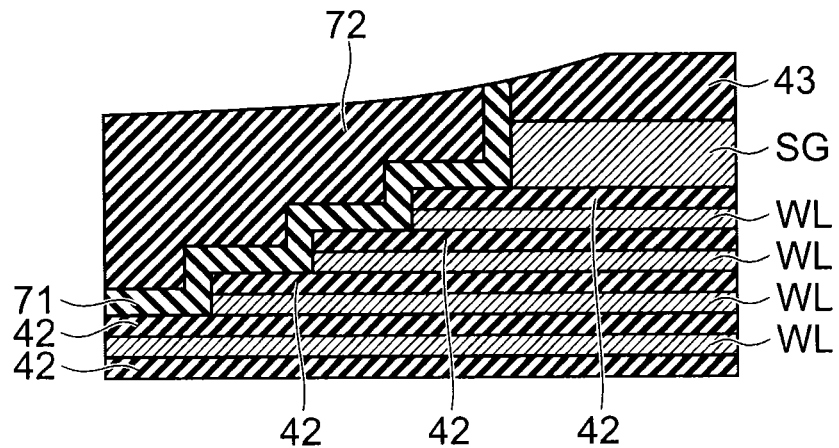

After the CMP, the stopper film 71 on the second stacked body is removed by etching (RIE) (FIG. 22A). At this time, also the insulating film 43 under the thinned portion of the stopper film 71 may become thin.

Figure 22B:
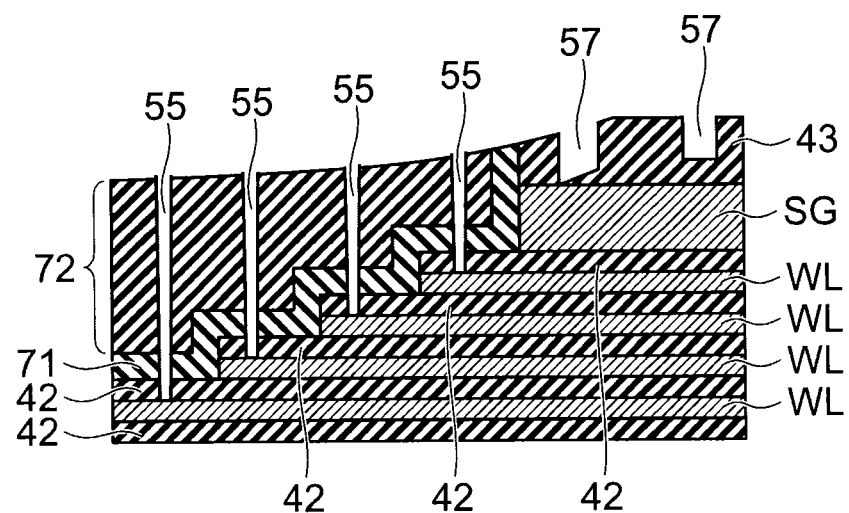

If a portion with a locally small thickness is created in the insulating film 43 on the select gate SG, when forming the trench 57 in the insulating film 43 in a later process, the trench 57 may reach the select gate SG as shown in FIG. 22B. If the trench 57 reaches the select gate SG, the select gate SG will short-circuit with an upper interconnection that is not the connection object via a via buried in the trench 57.

In contrast, in the embodiment, the first stacked body is fashioned into a staircase configuration as shown in FIG. 10A before stacking the second stacked body including the conductive film 13 thicker than the electrode film WL. Therefore, as shown in FIG. 10C, the interlayer insulating film 72 can be formed on the staircase-like fashioned portion via the stopper film 71 without causing a large level difference on the upper surface of the interlayer insulating film 72.

Therefore, even in the case where the number of stairs is large and the staircase region is formed over a large area, planarization can be performed such that the height of the upper surface of the interlayer insulating film 72 is made to almost coincide with the height of the upper surface of the uppermost stair 54a, as shown in FIG. 11B showing the state after the interlayer insulating film 72 is processed by CMP and the stopper film 71 on the uppermost stair 54a is removed.

On the planarized surface, the second stacked body including the conductive film 13 and the insulating film 43 is formed as shown in FIG. 11C. Part of the conductive film 13 is left as the select gate SG on the uppermost stair 54a as shown in FIG. 12A.

Also above the staircase region 53 below the uppermost stair 54a, part of the conductive film 13 is left as the wall portion 73.

A large level difference is formed between the second stacked body including the select gate SG and the first stacked body including the plurality of electrode films WL, and an insulating film that fills the level difference is formed in a later process. At this time, since the second stacked body including the wall portion 73 and the insulating film 43 thereon is provided also on the staircase region 13, the possibility is reduced that a large level difference will be formed on the upper surface of the insulating film (the insulating film 84 in FIG. 14A) filling the level difference between the select gate SG and the first stacked body.

Therefore, as shown in FIG. 16A showing the state after the insulating film 84 is ground by the CMP method and the insulating film 83 on the second stacked body is removed, planarization can be performed such that the height of the upper surface of the insulating film 84 is made to almost coincide with the height of the upper surface of the second stacked body (the height of the upper surface of the insulating film 43).

Thus, a portion with a small thickness being locally formed in the insulating film 43 on the select gate SG can be prevented, and the trench 57 shown in FIG. 17A formed in the insulating film 43 can be prevented from reaching the select gate SG. Consequently, the select gate SG can be prevented from short-circuiting with an upper interconnection that is not the connection object via a via buried in the trench 57.

The planar pattern configuration of the second stacked body on the staircase region 53 is not limited to that of the embodiment described above. The second stacked body on the staircase region 53 needs only to be laid out on the staircase region 53 with such a spacing or density that a large level difference is not caused on the upper surface of the insulating film 84 during the formation of the insulating film 84 shown in FIG. 14A. The second stacked body on the staircase region 53 is not formed in the portion where the via 56 will be formed.

Figure 18A:
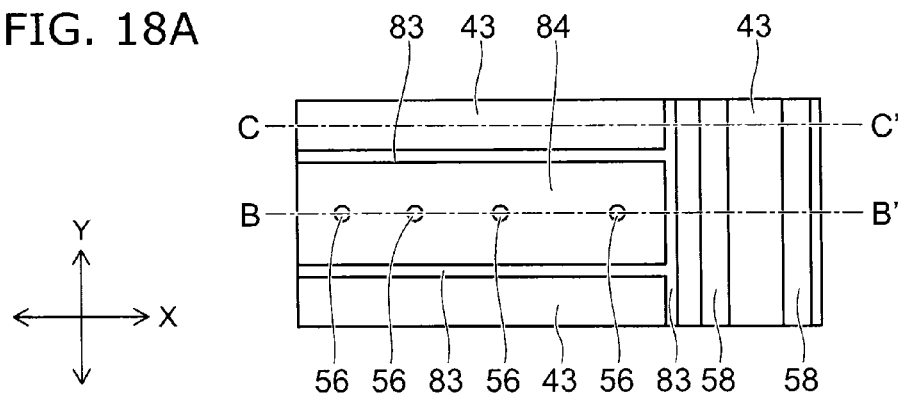
FIG. 18A to FIG. 19 are schematic views showing other specific examples of the staircase-like contact unit in the semiconductor device according to the embodiment.
Figure 19:
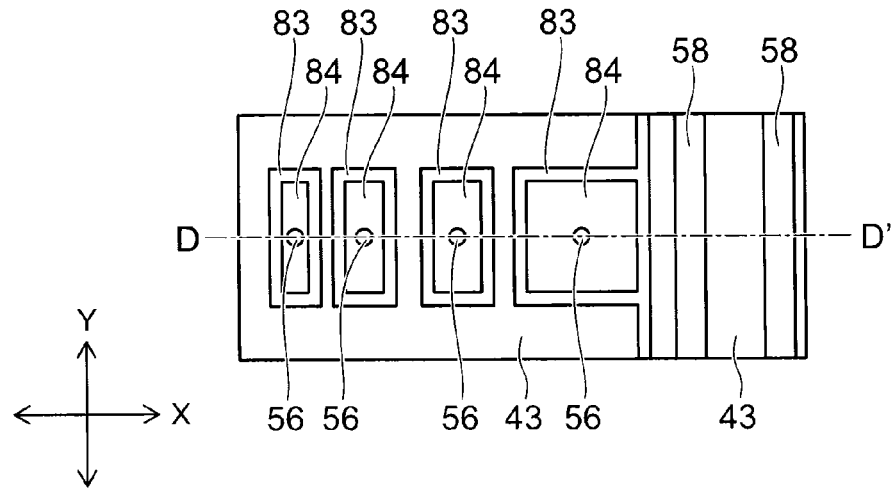

FIG. 18A and FIG. 19 show other specific examples of the planar pattern configuration of the second stacked body on the staircase region 53.

Figure 18B:
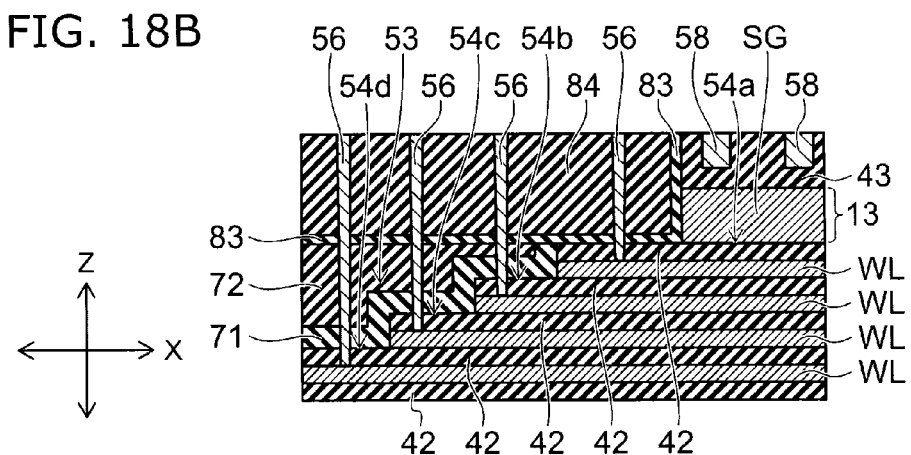
Figure 18C:
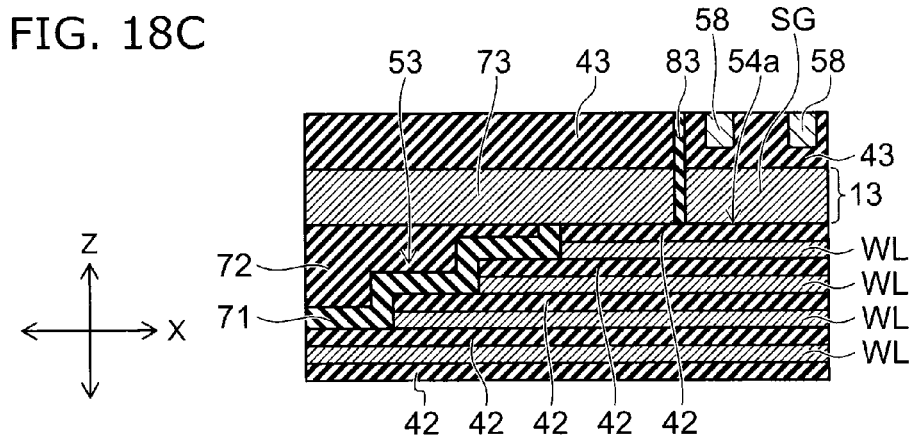

FIG. 18A is a schematic plan view corresponding to FIG. 4B described above, FIG. 18B corresponds to the B-B' cross section in FIG. 18A, and FIG. 18C corresponds to the C-C' cross section in FIG. 18A.

In this embodiment, the insulating film 83 surrounds the region where a plurality of vias 56 are formed. The insulating film 83 is provided also in a bottom portion of the region. In the region surrounded by the insulating film 83, the second stacked body is not provided, and the insulating film 84 is buried. The via 56 penetrates through the insulating film 84, the insulating film 83 under the insulating film 84, the interlayer insulating film 72 under the insulating film 83, the stopper film 71 under the interlayer insulating film 72, and the insulating film 42 under the stopper film 71, and is connected to the electrode film WL of each of the stairs 54b to 54d. The via 56 connected to the electrode film WL of the uppermost stair 54a penetrates through the insulating film 84, the insulating film 83, and the uppermost insulating film 42, and is connected to the uppermost electrode film WL.

On the outside of the region surrounded by the insulating film 83 where the via 56 is formed, the second stacked body including the wall portion 73 and the insulating film 43 is provided as shown in FIG. 18C. Therefore, also in this embodiment, a large level difference being formed on the upper surface of the insulating film 84 can be suppressed, and planarization can be performed such that the height of the upper surface of the insulating film 84 is made to almost coincide with the height of the upper surface of the insulating film 43 on the select gate SG.

Therefore, a portion with a small thickness being locally formed in the insulating film 43 on the select gate SG can be prevented, and the trench 57 formed in the insulating film 43 can be prevented from reaching the select gate SG.

FIG. 19 is a schematic plan view showing still another planar pattern configuration of the second stacked body, and corresponds to the schematic plan view of FIG. 4B described above. The D-D' cross section in FIG. 19 is the same as the cross section of FIG. 4A.

In the pattern example of FIG. 18A, the insulating film 83 surrounds a plurality of vias 56 collectively. On the other hand, in the pattern example of FIG. 19, each via 56 is individually surrounded by the insulating film 83. In the region surrounded by the insulating film 83, the second stacked body is not provided, and the insulating film 84 is buried.

The via 56 penetrates through the insulating film 84, the insulating film 83 under the insulating film 84, the interlayer insulating film 72 under the insulating film 83, the stopper film 71 under the interlayer insulating film 72, and the insulating film 42 under the stopper film 71, and is connected to the electrode film WL of each of the stairs 54b to 54d. The via 56 connected to the electrode film WL of the uppermost stair 54a penetrates through the insulating film 84, the insulating film 83, and the uppermost insulating film 42, and is connected to the uppermost electrode film WL.

On the outside of the region surrounded by the insulating film 83 where the via 56 is formed, the second stacked body including the wall portion 73 and the insulating film 43 is provided. Therefore, also in this embodiment, a large level difference being formed on the upper surface of the insulating film 84 can be suppressed, and planarization can be performed such that the height of the upper surface of the insulating film 84 is made to almost coincide with the height of the upper surface of the insulating film 43 on the select gate SG.

Thus, a portion with a small thickness being locally formed in the insulating film 43 on the select gate SG can be prevented, and the trench 57 formed in the insulating film 43 can be prevented from reaching the select gate SG.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a first stacked body including a first insulating film and a first conductive film alternately stacked in a plurality and including a plurality of stairs processed in a staircase configuration;
    an interlayer insulating film provided on the stairs so as to fill a level difference between the stairs;
    a second stacked body provided on the interlayer insulating film and on an uppermost stair and including a second conductive film and a second insulating film provided on the second conductive film, the second conductive film being thicker than the first conductive film and including a select gate on the uppermost stair and a plurality of wall portions in a staircase region below the uppermost stair; and a plurality of vias extending in a stacking direction of the first insulating film and the first conductive film in the interlayer insulating film under a region between the wall portions and being connected to the first conductive film of each of the stairs.

2. The device according to claim 1, further comprising a stopper film provided between the stairs and the interlayer insulating film and made of a different material from the interlayer insulating film.

3. The device according to claim 1, further comprising:
a channel body extending in the stacking direction in the first stacked body; and
a memory film provided between the channel body and the first conductive film and including a charge storage film.

4. The device according to claim 1, further comprising an insulating film provided between the wall portions.

5. The device according to claim 4, wherein the insulating film includes
a third insulating film provided on a side wall of the wall portions and an upper surface of the interlayer insulating film; and
a fourth insulating film provided on a side surface and the upper surface of the third insulating film and made of a different material from the third insulating film.

6. The device according to claim 4, wherein the insulating film is provided also between the select gate and the wall portions.

7. The device according to claim 1, wherein the select gate is provided on the uppermost stair without interposing the interlayer insulating film.

8. The device according to claim 1, further comprising an upper via buried in the second insulating film.

9. The device according to claim 8, wherein the upper via is not in contact with the select gate.

* * * * *